United States Patent [19]
Yamada et al.

[11] Patent Number: 5,460,858
[45] Date of Patent: Oct. 24, 1995

[54] METHOD FOR FORMING A SMOOTH-SURFACED INSULATING LAYER

[75] Inventors: Shinji Yamada; Masaharu Shirai, both of Ohtsu, Japan

[73] Assignee: International Business Machines Corporation, Armonk, N.Y.

[21] Appl. No.: 183,092

[22] Filed: Jan. 18, 1994

[30] Foreign Application Priority Data

Jan. 18, 1993 [JP] Japan .................................. 5-005713

[51] Int. Cl.⁶ .............................. B05D 3/02; B05D 3/04; B05D 3/06
[52] U.S. Cl. .......................... 427/510; 427/96; 427/335; 427/336; 427/385.5; 430/327
[58] Field of Search .............................. 427/96, 259, 335, 427/336, 510, 385.5; 430/327, 30

[56] References Cited

U.S. PATENT DOCUMENTS 3,684,553  8/1972  Van Dyk .................................. 427/335

Primary Examiner—Terry J. Owens
Attorney, Agent, or Firm—Bernard Tiegerman

[57] ABSTRACT

A method for forming a wrinkle-free insulating layer from a resin having both photo-curing and thermosetting properties by reducing the magnitude of a concentration gradient of residual solvent in the thickness direction of the resin layer after drying the resin layer and prior to photo-curing, developing and thermosetting the resin layer. In one embodiment, such reduction is achieved by passing a substrate bearing the resin layer by a roll coater charged with a solvent for the resin, and allowing solvent to be absorbed by the resin layer. The solvent application roll can be spaced from the resin layer by a small gap such that solvent vapor is applied to the resin layer. Alternatively, solvent in liquid form can be applied to the resin layer. In another embodiment, the concentration gradient of residual solvent in the resin layer is reduced by affixing a barrier film to the resin layer and then heating the resin layer.

5 Claims, 4 Drawing Sheets

METHOD FOR FORMING A SMOOTH-SURFACED INSULATING LAYER

BACKGROUND OF THE INVENTION

1. Field of the Invention

The present invention relates generally to a method for forming an insulating layer and, more particularly, concerns a method for forming a wrinkle-free insulating layer from a resin having photo-curing and thermosetting properties.

2. Description of the Related Art

Conventionally, two methods have been used for forming a patterned insulating resin layer such as a solder mask on a substrate. The first such method is to thermoset the insulating resin after forming a pattern of the resin layer by screen pattern printing during resin coating. The second such method is to apply a resin having both photo-curing and thermosetting properties to the substrate and cure the resin by heating after forming a pattern (photo-via holes 11 as shown in FIG. 3) through photo-curing and developing. For example, as illustrated in FIG. 4, a lower-layer circuit pattern is first formed on the substrate, and then an insulating resin solution having both photo-curing and thermosetting properties is applied onto the substrate and this lower-layer circuit pattern. After being dried, this resin layer is pattern-exposed (photo-cured). The pattern thus formed is developed and photo-cured as a final cure.

When fine pattern formation is required, the second method is normally used. This method involves a two-stage setting of resins, that is, photo-curing and thermosetting. Among resins, during the stage of photo-curing, some are photo-cured to the inside because an absorption coefficient of the resin is low and light passes to the inside fully, and some are photo-cured only on the surface layer because of high absorption coefficient of the resin. When a resin is photo-cured to the inside, there is no likelihood of wrinkles occurring on the surface of the resin layer formed after photo-curing followed by thermosetting. On the other hand, when a resin is photo-cured only on the surface layer, wrinkles are formed on the surface of the resin layer after photo-curing followed by thermosetting. The formation of these wrinkles spoils the smoothness of the surface and raises problems associated with inspection, testing, and surface treatment. In particular, when the resin is employed as an insulating inner layer for use in multi-layer printed circuit boards, it is essentially required to have even surface of the insulating resin layer by grinding, etc., in order to form an upper-layer circuit pattern. It is also necessary to grind the roughness resulting from said wrinkles in addition to the roughness derived from a lower-layer circuit pattern. Accordingly, an amount of a resin greater than the ground quantity should be applied to grind the uneven area. When a smoothness needed for the formation of a circuit pattern by conventional etching is spoiled in the inner layer, such defects as short circuiting and broken wires result.

SUMMARY OF THE INVENTION

It is an objective of the present invention to provide a method for forming insulating layers which prevent the occurrence of the above-mentioned wrinkles on the surface of an insulating resin layer without spoiling resolution and electric and physical characteristics of that resin when forming on a substrate a pattern of the insulating resin layer having both photo-curing and thermosetting properties.

As a result of the inventors' intensive studies, it was concluded that the cause of the occurrence of wrinkles on the surface of the insulating resin layer is the existence of a concentration gradient associated with a residual solvent in the cross-sectioning (i.e., thickness) direction of the resin layer occurring during the drying process after coating of an insulating resin solution in the processes shown in FIG. 4. For example, it has been confirmed that allowing the solvent remaining in the resin layer to be nil or nearly so by natural drying prevents the occurrence of wrinkles on the surface of the insulating resin layer, but that it requires many hours and is not practical to completely remove the residual solvent without thermosetting. As a further result of their studies, they found out that the occurrence of wrinkles on the surface of the insulating resin layer after final curing can be prevented by reducing the magnitude of the concentration gradient of the residual solvent in the cross-sectioning (thickness) direction of the resin layer after the drying of the solvent, thus perfecting the present invention.

That is to say, the method for forming a smooth-surfaced insulating layer according to the present invention is characterized in that, during the formation of an insulating resin layer having both photo-curing and thermosetting properties in pattern form on a substrate, a treatment of the insulating resin layer to reduce the magnitude of the concentration gradient of a residual solvent is carried out after the coating and drying of an insulating resin solution, and after the magnitude of the concentration gradient of the residual solvent has been reduced in the cross-sectioning (thickness) direction of the insulating resin layer, the insulating resin layer is photo-cured, developed and thermoset.

In a first preferred embodiment of the method for forming a smooth-surfaced insulating layer according to the present invention, the magnitude of the concentration gradient of the residual solvent is reduced by absorbing additional solvent through the surface of the insulating resin layer after the coating and drying of the insulating resin solution. As a result, the solvent is more uniformly distributed in the cross-sectioning (thickness) direction of the insulating resin layer, and the corresponding magnitude of the concentration gradient is reduced.

In a second preferred embodiment of the method for forming a smooth-surfaced insulating layer according to the present invention, the magnitude of the concentration gradient of the residual solvent is reduced by initially providing a barrier layer, which is impermeable to the solvent, on a surface of the insulating resin layer, after the coating and drying of the insulating resin solution. Then, the insulating resin layer is heated in order to more uniformly distribute the solvent within the insulating resin layer.

BRIEF DESCRIPTION OF THE DRAWINGS

FIG. 3(A) is a schematic top view of the state of an insulating layer as formed via the prior art, while FIG. 3(B) is a similar view of an insulating layer as formed via the present invention.

DETAILED DESCRIPTION OF THE PREFERRED EMBODIMENTS

The present invention involves a method for preventing the occurrence of wrinkles in an insulating resin layer formed on a substrate. This is achieved, in accordance with the invention, by treating the insulating resin layer in such a way that the magnitude of a concentration gradient of a residual solvent in the insulating resin layer is reduced and the solvent distributed more evenly throughout the insulating resin.

The present invention is explained in further detail with reference to the following embodiment. Needless to say, the present invention will not be limited by this embodiment.

Figure 1:
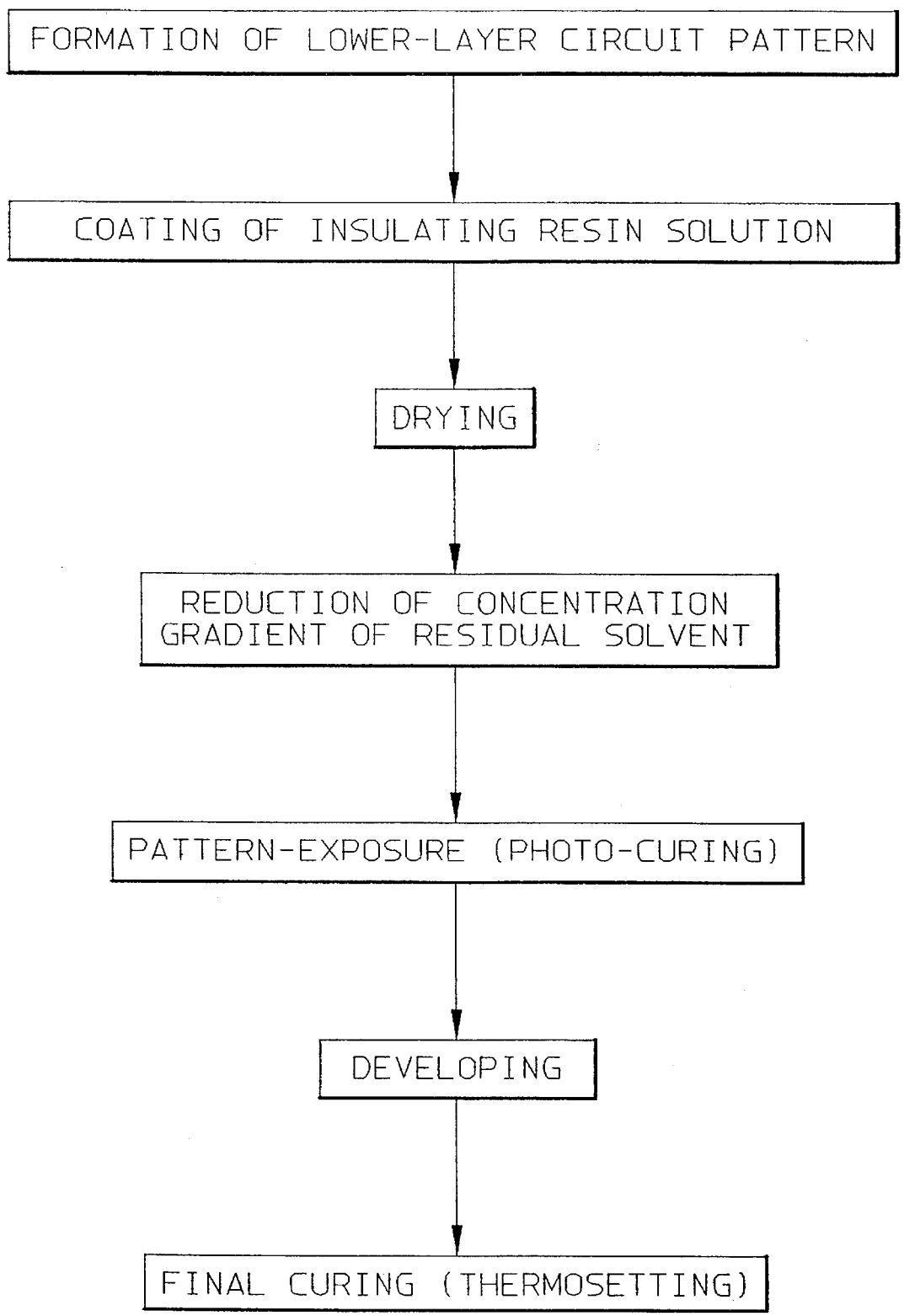
FIG. 1 is a process flow diagram showing the method for forming an insulating layer according to the present invention.

FIG. 1 is a process flow diagram explaining the method for forming a smooth-surfaced insulating layer according to the present invention. As shown in FIG. 1, the insulating layer is formed as follows:

(1) A lower-layer circuit pattern is formed on the substrate (the process of forming a lower-layer circuit pattern).

(2) Subsequently, an insulating resin solution having both photo-curing and thermosetting properties is applied onto the substrate and onto the lower-layer circuit pattern formed thereon and forms an insulating resin layer (process of coating an insulating resin solution). Epoxy resin having photosensitivity can, for example, be used as an insulating resin having both photo-curing and thermosetting properties. Typically, a liquid photosensitive epoxy resin sold under the trade name PROBIMER 52 by Ciba Geigy Japan Ltd. may be used.

(3) This insulating resin layer is dried (pre-cured) (the process of drying). That is to say, the solvent in the insulating resin layer is evaporated through pre-curing, and the tackiness on the surface disappears. Consequently, the solvent transpires since the surface of the insulating resin layer comes into contact with the air having 0% solvent concentration. Thus, a concentration gradient of the residual solvent then occurs in the inner portion (in the cross-sectional direction).

(4) The magnitude of the concentration gradient of the dried insulating resin layer is reduced (the process of reducing the concentration gradient of the residual solvent).

(5) The insulating resin layer treated to reduce the magnitude of the concentration gradient of the residual solvent is pattern-exposed (photo-cured) to form a pattern (the process of pattern-exposure, i.e., the process of photo-curing).

(6) The pattern thus formed is developed (the process of developing).

(7) The developed pattern is thermoset as a final cure (the process of thermosetting).

The aforementioned processes (1)–(3) and (5)–(7) are virtually the same as in the past; therefore, the means and materials employed in the prior art may be used. The existence of process (4), that is, the process of reducing the magnitude of the concentration gradient of the residual solvent, is the particular strength of the method of forming a smooth-surfaced insulating layer according to the present invention. The occurrence of wrinkles on the surface of the insulating resin layer can be prevented by reducing the residual solvent in the resin to be nil or nearly so. Nevertheless, it takes many hours and is not practical to completely remove the residual solvent without thermosetting. On the other hand, unless the solvent is used, there should be no occurrence of wrinkles due to the occurrence of the concentration gradient of the solvent. However, at present, this case is not practical in view of the fact that as to photosensitive epoxy resin, types containing solvent are conventionally used. As mentioned above, it is of course also impractical to pre-cure the resin layer until the solvent is gone because this process takes far too much time. Thus, the means that may be practically employed is to reduce the magnitude of or get rid of the concentration gradient of the residual solvent occurring during the pre-cure process.

In the present invention, the reduction of the magnitude of the concentration gradient, i.e. homogenization, of the residual solvent may be accomplished through a variety of methods. For example, it is possible to provide on the surface of the insulating resin layer a barrier layer impermeable to the solvent used, heat the insulating resin layer, and evenly distribute the solvent within the portion enclosed by this barrier layer. An impermeable film (such as polyethylene terephthalate film) may be used as the barrier layer. They may also be pressed in a press and then heated, or held between heated belts. Furthermore, the evenness of the concentration gradient of the residual solvent may also be accomplished by heating in an autoclave under pressure.

Alternatively, the magnitude of the concentration gradient of the residual solvent may be reduced by applying solvent absorption process to the pre-cured insulating resin layer and absorbing the solvent throughout the surface. When the magnitude of the concentration gradient of the residual solvent is reduced by the solvent absorption process, the solvent (thinner) for the insulating resin comprising the insulating layer can be used as a solvent for this process. This solvent may be different from, or the same as, the solvent of the insulating resin solution used in process (2). Vaporizing solvent and bringing the solvent vapor into direct contact with the surface of the resin layer, or directly applying the solvent to the surface of the resin layer are proposed as methods for absorbing the solvent into the surface of the resin layer. Whenever the solvent in a gas or liquid phase is brought into contact with the surface of the resin layer, it is absorbed into the resin layer, and the magnitude of the concentration gradient of the solvent absorbed into the resin layer is reduced, and the advantage of wrinkles being eliminated is obtained by either of the methods.

Figure 2:
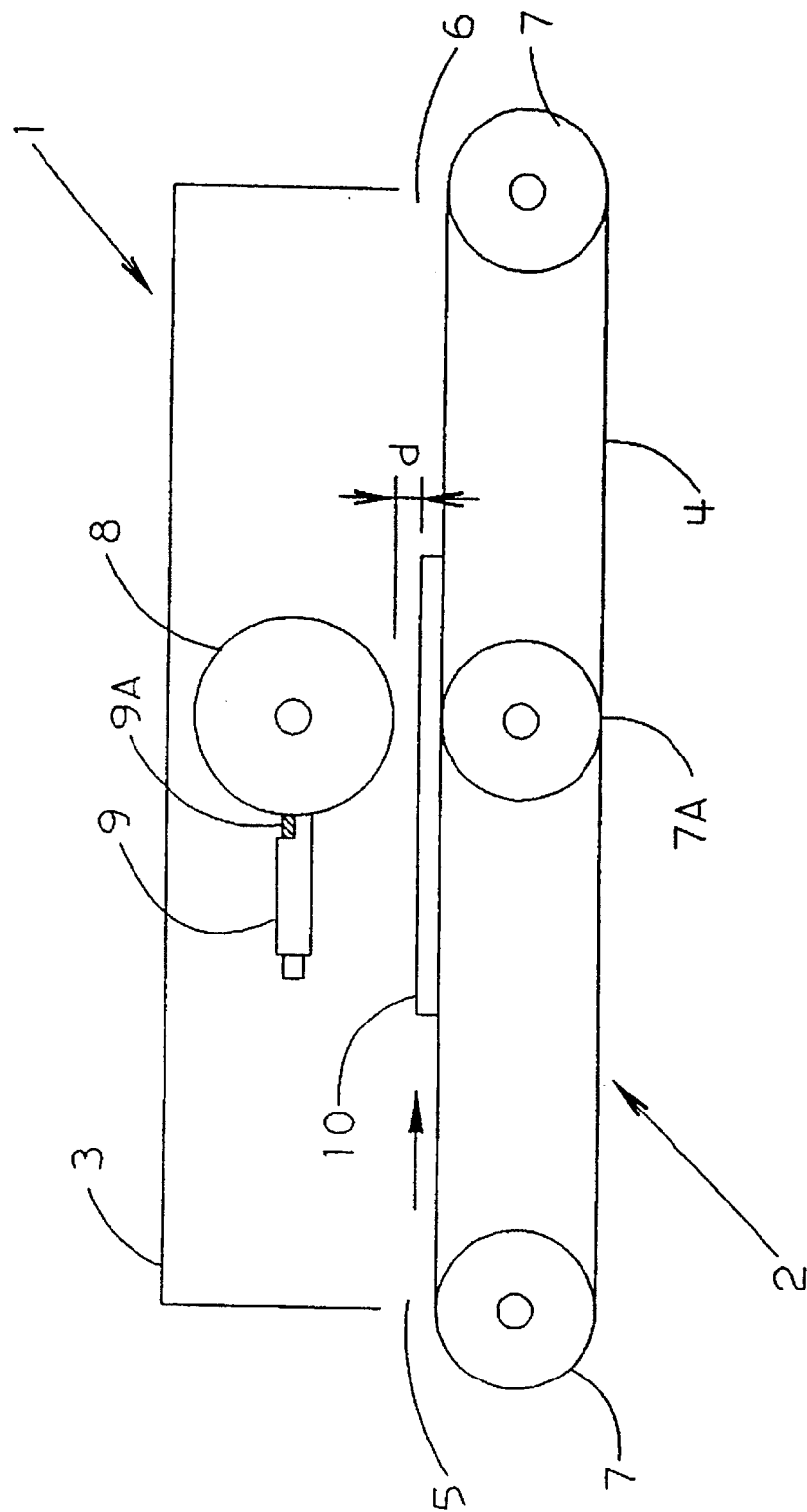
FIG. 2 is a schematic cross-sectional diagram showing the roll coater for use in the process of solvent absorption by the method for forming an insulating layer according to the present invention.

FIG. 2 is a schematic diagram of a roll-coater used for the process of solvent absorption by the method for forming a smooth-surfaced insulating layer according to the present invention. Numeral 1 is the roll-coater, 2 a belt conveyor, 3 a cover, 4 a belt, 5 an inlet, 6 an outlet, 7 a conveyance roll, 7A a backup roll, 8 a solvent application roll, 9 a doctor bar, 9A a solvent supplier, and 10 the substrate.

The process of solvent absorption as the process of reducing the magnitude of the concentration gradient of the residual solvent (4) is explained in detail with reference to FIG. 2. The roller coater 1 possesses the belt conveyor 2 and the cover 3 covering thereover. The inlet 5 and the outlet 6 of the substrate 10 are furnished between the belt 4 of the belt conveyor 2 and the cover 3. In this illustration, the belt conveyor 2 possesses one each of the conveyance rolls 7, 7 at positions corresponding to the inlet 5 and the outlet 6, respectively, and there is a backup roll 7A between them. The solvent application roll is set 8 over belt conveyor 2 corresponding to the backup roll 7A. This solvent application roll 8 is set at a gap d as close as possible to the upper surface of the substrate 10 on the belt 4 without making contact. The doctor bar 9 is disposed opposite to the solvent application roll 8 and feeds a solvent to the solvent application roll 8 from the solvent supplier 9A. The substrate 10, with a dry insulating resin layer on its surface after passing through the aforementioned process (3), is transported through inlet 5 and transported on the belt 4 of belt conveyor 2 driven by rolls 7, 7, and 7A and arrives beneath the solvent application roll 8. During the passing of the substrate, the solvent vapors evaporated from the surface of the solvent application roll 8 are absorbed by the resin layer. In this case, since the solvent application roll 8 does not come into contact with the substrate, the lower-layer circuit pattern provided on the substrate will not be deformed. The substrate 10, having completed the process of solvent absorption, is transported through outlet 6 to the next process of pattern exposure (photo-curing). Thereafter, the substrate is processed in the same manner as in the prior art, and an insulating layer is formed.

In summary, in the present invention, when a pattern of an insulating resin layer having photo-curing and thermosetting properties is formed on a substrate, the occurrence of wrinkles in the photo-cured, developed and thermoset insulating layer is effectively prevented by following the coating and drying of the insulating resin solution, the insulating resin layer being treated in such a way that the magnitude of the concentration gradient of the residual solvent is reduced, and the magnitude of the concentration gradient of the residual solvent in the cross-sectional direction of the insulating resin layer thereby being reduced.

In particular, the occurrence of wrinkles in the insulating layer is effectively prevented because, after the coating and drying of the insulating resin solution, the solvent is to be absorbed through the surface of the insulating resin layer.

At the same time, the occurrence of wrinkles in the insulating layer is effectively prevented because, after the coating and drying of the insulating resin solution, the insulating resin layer is heated after providing a barrier layer impermeable to the solvent on the surface of the insulating resin layer.

Moreover, the occurrence of wrinkles in the insulating layer is effectively prevented because, after the coating and drying of the insulating resin solution, the insulating resin layer is allowed to pass near a roller impregnated with the solvent so that the solvent is absorbed through the surface of the insulating resin layer.

Furthermore, the occurrence of wrinkles in the insulating layer is also effectively prevented, because a film is affixed onto the surface of the insulating resin layer and the insulating resin layer is heated, so that the barrier layer impermeable to the solvent can be provided on the surface of the insulating resin layer and the insulating resin layer can be heated.

EXAMPLE 1

Onto the copper-clad substrate 10 for printed circuit boards on which circuits have been formed by the conventional technique, a liquid photosensitive epoxy resin of PROBIMER 52 (Ciba Geigy Japan Ltd.) was applied to a dried thickness of 60 μm, and dried by heating at 90° C. for 2 hours. Subsequently, the roll coater 1, shown in FIG. 2, was used and the PROBIMER 52 thinner fed by the solvent supplier 9A was evaporated from the surface of the solvent application roll 8. The resin coated substrate was passed by the belt conveyor 2 by roll coater 1 charged with solvent vapors at a speed of 25 cm/min at the gap d of 1.5 mm between the upper surface of the substrate and the lower end of the solvent application roll 8 so that there is no contact between the coated and dried resin surface and the solvent application roll 8. Then the substrate was developed by exposing to light of 3 J/cm$^2$ through the mask film by a high-pressure mercury vapor lamp and thermoset by heating at 135° C. for 2 hours. The surface of the resin coated substrate was free from wrinkles and was satisfactory.

EXAMPLE 2

Figure 3:
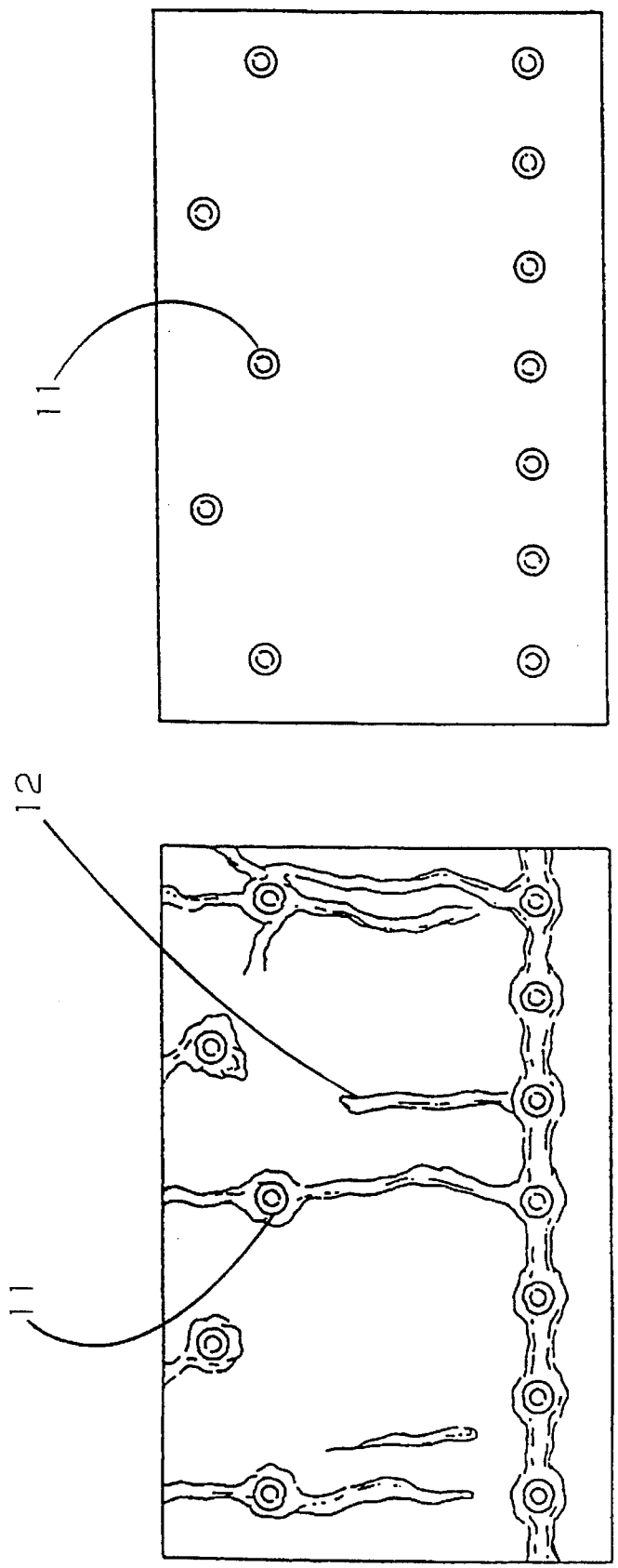
Figure 4:
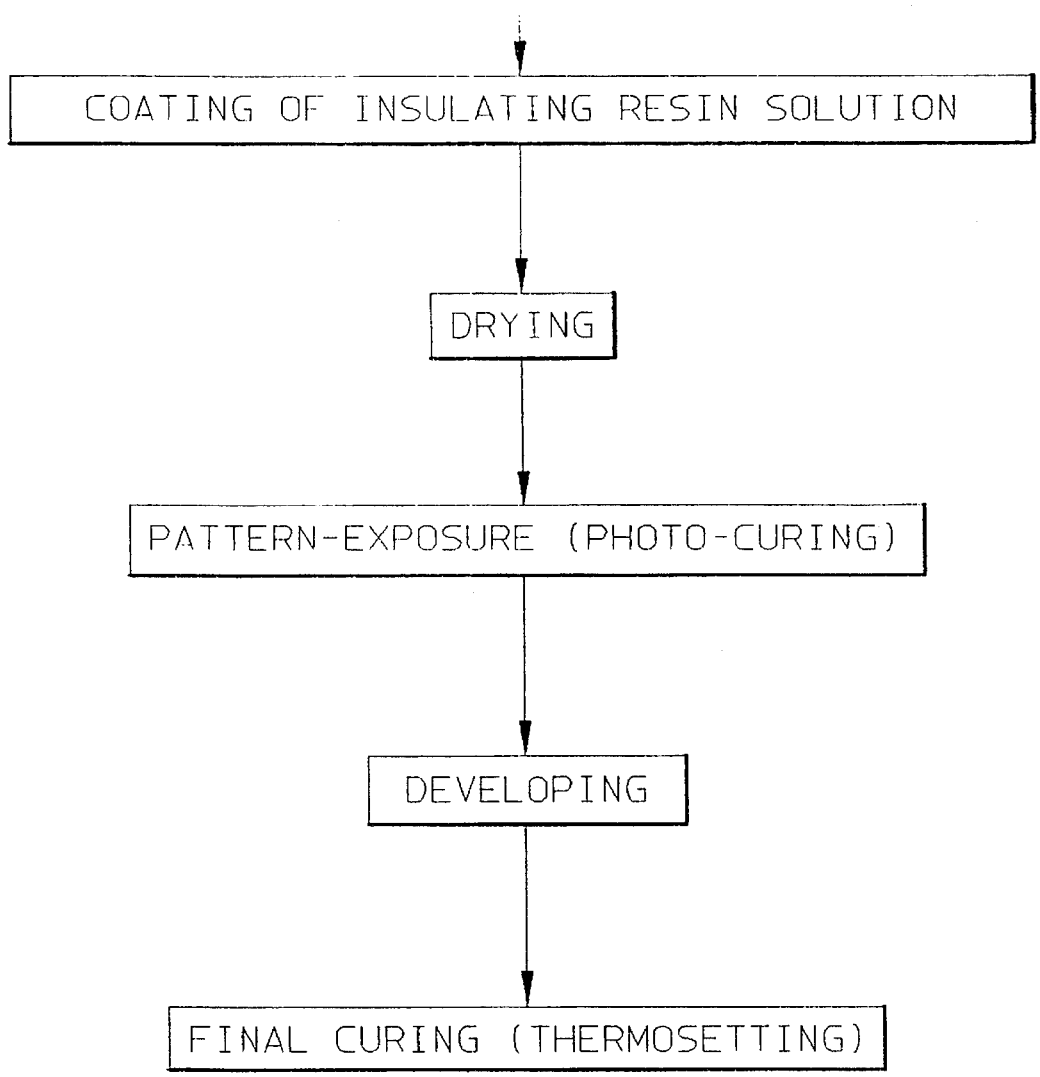
FIG. 4 is a diagram of the conventional process for forming an insulating layer.

Onto the surface of the pre-cured, liquid photosensitive epoxy resin PROBIMER 52, a MYLAR (registered trade name of polyethylene terephthalate manufactured by Du Pont Ltd.) film was affixed using a film applicator. During this film application, the temperature of a rubber roll was 80° C. In one of the samples, the MYLAR film was peeled off and exposed to light (comparison case), while, in another sample, after being heat-treated for 30 min in an oven maintained at 80° C., the MYLAR film was peeled off and the sample was exposed to light (the present invention). These two samples were simultaneously thermoset after being developed under the same conditions. The results are shown in FIG. 3. FIG. 3 is a schematic top view of the state of the insulating layer; (A) is a control case, and (B) is the present invention. As shown in FIG. 3(A), in the control case sample, the occurrence of wrinkles 12 was clearly observed adjacent to the photo-via holes 11 and between the photo-via holes 11, whereas in the sample of the present invention, no wrinkles were observed (FIG. 3(B)).

We claim:

1. A method of forming a smooth-surfaced insulating layer, comprising the steps of:

coating a substrate with a solution of an insulating resin dissolved in a solvent, said insulating resin having photo-curing and thermosetting properties;

drying said solution, to thereby form a layer of said insulating resin on said substrate;

reducing the magnitude of a concentration gradient of residual solvent in a thickness direction of said insulating resin layer; then photo-curing selected regions of said insulating resin layer;

developing said insulating resin layer; and causing said insulating resin layer to undergo thermosetting.

2. The method of claim 1, wherein said substrate includes a circuit formed thereon.

3. A method of forming a smooth-surfaced insulating layer, comprising the steps of:

coating a substrate with a solution of an insulating resin dissolved in a solvent, said insulating resin having photo-curing and thermosetting properties;

drying said solution, to thereby form a layer of said insulating resin on said substrate; and reducing the magnitude of a concentration gradient of residual solvent in a thickness direction of said insulating resin layer, said reducing step including the step of absorbing solvent into said insulating resin layer through a surface of said layer.

4. The method of claim 3, wherein said absorbing step includes the step of passing said insulating resin layer close to a roller impregnated with solvent.

5. A method of forming a smooth-surfaced insulating layer, comprising the steps of:

coating a substrate with a solution of an insulating resin dissolved in a solvent, said insulating resin having photo-curing and thermosetting properties;

drying said solution, to thereby form a layer of said insulating resin on said substrate; and reducing the magnitude of a concentration gradient of residual solvent in a thickness direction of said insulating resin layer, said reducing step including the steps of (i) providing a barrier layer on a surface of said insulating resin layer, which barrier layer is substantially impermeable to said solvent, and (ii) heating said insulating resin layer.

* * * * *